United States Patent

[11] 3,607,474

[72] Inventor Samuel H. Hensdale
Kernersville, N.C.
[21] Appl. No. 700,696
[22] Filed Jan. 26, 1968
[45] Patented Sept. 21, 1971
[73] Assignee The United States of America as represented by the Secretary of the Army

[54] METHOD OF MAKING AN OPTICAL MASK FOR REPRODUCING CIRCUIT BOARDS
2 Claims, No Drawings

[52] U.S. Cl. .......... 156/3, 156/12, 95/1
[51] Int. Cl. .......... B32b 31/24, B44b 1/22
[50] Field of Search .......... 156/3, 12, 13, 18; 29/675, 155 H, 625, 626

[56] References Cited

UNITED STATES PATENTS 2,888,335 5/1959 Atkins et al. .......... 156/12
3,448,516 6/1969 Buck .......... 156/3
3,325,691 6/1967 Dahlgren et al. .......... 29/626

OTHER REFERENCES

Ingraham " Photolithographic Masks for Integrated & Thin Film Circuitry" SCP & Solid-State Technology Mar. 1965 pps. 33, 34 and 38- 42

*Primary Examiner*—Robert F. Burnett
*Assistant Examiner*—R. J. Roche
*Attorneys*—Harry M. Saragovitz, Edward J. Kelly, Herbert Berl and Aubrey J. Dunn

ABSTRACT: A method of making an etched stripline circuit board comprising a copper-clad substrate covered with an etch-resist Mylar tape. A precision coordinatograph is employed for cutting the circuit through the Mylar tape on a 1:1 scale; unneeded portions of the tape are stripped away, and the remaining portions of the tape are utilized as a resist during an etching process.

METHOD OF MAKING AN OPTICAL MASK FOR REPRODUCING CIRCUIT BOARDS

BACKGROUND OF THE INVENTION

This invention is related in general to electrical circuit boards and in particular to printed circuits for microwave striplines.

The standard method of producing etched boards includes the following operations. A large scale art master of the circuit configuration is cut on a special Mylar, polyethylene terephthate material by the use of a coordinatograph. This oversized art master is inspected for accuracy on a second coordinatograph; then the art master is photographed and reduced to produce a 1:1 scale negative, which is checked for accuracy of reduction and rephotographed if necessary to obtain the desired reduction. From this negative a master glass plate is produced which is used to contact print the circuit configuration on copper clad substrate material, covered by a photosensitive etch-resistant material. The exposed resist material coated boards are developed and etched.

The glass plate master is inspected for quality of printing and imperfections are removed by standard photographic techniques. Most of the imperfections are due to entrapment of dust particles, which produce spots in the glass plate master. If the spots are not removed, they cause pin holes in the circuit paths or allow dots of copper to remain unetched in the area between circuit paths.

SUMMARY OF THE INVENTION

The invention is a process for producing etched circuit boards without the time consuming photographic steps of the regular production process, while at the same time utilizing the high precision tools employed in the regular process. The development and use of the present process enables one to provide stripline model-making facilities with a minimum of investment and reduces the cost of stripline models.

DESCRIPTION OF THE PREFERRED EMBODIMENT

In the present invention, a copper-clad substrate, normally a 0.005 inch thick Mylar sheet, is covered on the copper-clad side with a 0.001 inch thick Mylar tape. Using a precision coordinatograph, the circuit is cut, on a 1:1 scale, in this tape overlay. All the tape overlay except that which represents the circuit configuration is then stripped away. The tape which outlines the circuit serves as an etch resist; and as the circuit is cut on a 1:1 scale, it is ready to be etched. The circuit is etched with a suitable chemical agent, thereby removing the exposed copper by the corrosive action of the etch on the copper. After the circuit is etched on the copper-clad Mylar, the circuit which results in an optical mask can be sandwiched between thicker dielectric substrates for testing to determine the value thereof. A copy of the circuit can be produced by using this original optical mask as a master since, after etching, the Mylar carrier for the circuit is translucent in the areas where no circuit appears. Modifications can be made in the copy by placing tape or other materials on the master prior to production of the copy. The original circuit can be used as this optical mask as a master to print on photosensitive resist-coated material as is done in the conventional photo etching process.

Since 1:1 contact printing is all that is required, there is no possibility for errors in reduction; since only negative prints are produced on the subsequent models of the circuit, dust particles will not create circuit pinholes. Flecks of copper between circuits can be removed after etching if necessary. No pinholes appear in the original optical mask circuit since the Mylar overlay is used as an etch resist.

An incorrect master has a low financial impact and therefore only cursory inspection is performed on the master. The model is evaluated primarily through its electrical performance. It is necessary to inspect the model only where a performance deviation from expected results occurs, to establish whether the deviation is from design or model error.

Although a particular method for performing this invention has been described, it is understood that modification may be made by those skilled in the art without departing from the scope and spirit of the foregoing disclosure. The invention should be limited in scope only by the claims.

I claim:

1. A process for producing an optical mask for reproducing etched circuit boards comprising the steps of: providing a copper-coated sheet of polyethylene terephthalate; covering said copper-coated sheet of polyethylene terephthalate on the copper-coated side with an etch-resist overlay film of polyethylene terephthalate of approximately 0.001 inches thick; cutting a circuit outline in said polyethylene terephthalate etch-resist overlay film; removing that portion of the overlay film which does not represent the circuit outline; and removing the exposed copper from said copper-coated sheet of polyethylene terephthalate by etching said exposed copper with a suitable chemical agent whereby an optical mask of a polyethtlene terephthalate base having a copper-coated circuit outline overlayed with a film of polyethylene terephthalate having an outline corresponding to said copper-coated circuit outline is produced.

2. The process as set forth in claim 1 wherein a polyethylene terephthalate sheet of approximately 0.005 inches thick is utilized as said substrate.